United States Patent
Brown et al.

(10) Patent No.: US 7,278,872 B2
(45) Date of Patent: Oct. 9, 2007

(54) METHOD AND APPARATUS FOR RETAINING A CARD IN AN INFORMATION HANDLING SYSTEM

(75) Inventors: Gregory Brown, Austin, TX (US); Tifenn Boisard, Austin, TX (US); Marco A. Marroquin, Pflugerville, TX (US); William Morris, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 11/170,802

(22) Filed: Jun. 30, 2005

(65) Prior Publication Data

US 2007/0004264 A1 Jan. 4, 2007

(51) Int. Cl.
*H01R 13/627* (2006.01)

(52) U.S. Cl. .................. 439/351; 439/327; 361/801
(58) Field of Classification Search ............... 439/351, 439/352, 325–328; 361/801
See application file for complete search history.

(56) References Cited

U.S. PATENT DOCUMENTS

| 5,383,793 | A | * | 1/1995 | Hsu et al. .................. 439/327 |
| 5,943,218 | A | * | 8/1999 | Liu ............................ 361/801 |
| 6,056,574 | A | * | 5/2000 | Yeomans et al. ........... 439/327 |
| 6,229,709 | B1 | * | 5/2001 | Hardt et al. ................ 361/753 |
| 6,299,468 | B1 | * | 10/2001 | Lin .............................. 439/327 |
| 6,358,079 | B1 | | 3/2002 | Noble |
| 6,361,343 | B1 | | 3/2002 | Daskalakig |
| 6,545,877 | B1 | | 4/2003 | Agha |
| 6,551,120 | B2 | | 4/2003 | Daskalakig |
| 6,885,565 | B2 | * | 4/2005 | Shi ............................ 361/801 |

* cited by examiner

*Primary Examiner*—Xuong Chung-Trans
(74) *Attorney, Agent, or Firm*—Haynes and Boone, LLP (57) ABSTRACT

A card retaining apparatus includes a reinforced card support post including a board mounting member and a card securing device which is operable to couple to the reinforced card support post. The reinforced card support post may be mounted to a board adjacent a card connector and the card securing device coupled to the card support post to retain a card in the card connector.

17 Claims, 8 Drawing Sheets

METHOD AND APPARATUS FOR RETAINING A CARD IN AN INFORMATION HANDLING SYSTEM

BACKGROUND

The present disclosure relates generally to information handling systems, and more particularly to retaining a card in an information handling system.

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems typically include expansion cards such as, for example, video cards, which couple to the information handling system to carry out functions for the information handling system. As the power requirements for these cards increase, the cards increase in weight, which raises issues with respect to the retaining of the card in the information handling system, particularly during shock or vibration events.

These cards typically couple to a connector which is mounted to the information handling system and are retained in the connector by a bracket mounted to an end of the card. During a shock or vibration event, the card can become decoupled from the connector due to movement of the card. Additionally, the card can flex from side to side during shock or vibration events, which can result in damage to the connector or damage to components on the card such as, using graphics cards as an example, the cracking of the solder balls on the graphics processing unit (GPU).

Conventional solutions to this problem are to use a retention device which mounts to the connector and includes a retaining member that secures the card vertically in the connector. However, the retention force provided is limited by the strength of the mounting means used to mount the connector to the information handling system, and during a shock and vibration event the mounting means can fail, resulting in damage to the connector and/or the information handling system. Furthermore, these conventional solutions continue to allow the card to flex and are prone to the problems described above, as they are only designed to limit the vertical movement of the card.

Accordingly, it would be desirable to provide for retaining a card in an information handling system absent the disadvantages found in the prior methods discussed above.

SUMMARY

According to one embodiment, a card retaining apparatus is provided which includes a reinforced card support post comprising a board mounting member and a card securing device which is operable to couple to the reinforced card support post.

A principal advantage of this embodiment is that the card support post may be mounted to a board adjacent a card connector and a card may be retained in the card connector by coupling the securing device to the card support post to engage the card and reduce flexing of the card.

BRIEF DESCRIPTION OF THE DRAWINGS

FIG. 4 is a perspective view illustrating an embodiment of a card used with the card support post of FIG. 2 and the securing device of FIG. 3a.

FIG. 6b is a perspective view illustrating an embodiment of the card support post of FIG. 2 being mounting to the board of FIG. 5 during the method of FIG. 6a.

FIG. 6c is a perspective view illustrating an embodiment of the card of FIG. 4 being coupled to the board of FIG. 6a during the method of FIG. 6a.

FIG. 6d is a perspective view illustrating an embodiment of the card of FIG. 4 coupled to the board of FIG. 6a during the method of FIG. 6a.

FIG. 6e is a perspective view illustrating an embodiment of the securing device of FIG. 3 being coupled to the card support post of FIG. 6d during the method of FIG. 6a.

FIG. 6f is a perspective view illustrating an embodiment of the securing device of FIG. 3 coupled to the card support post of FIG. 6d during the method of FIG. 6a.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 1:
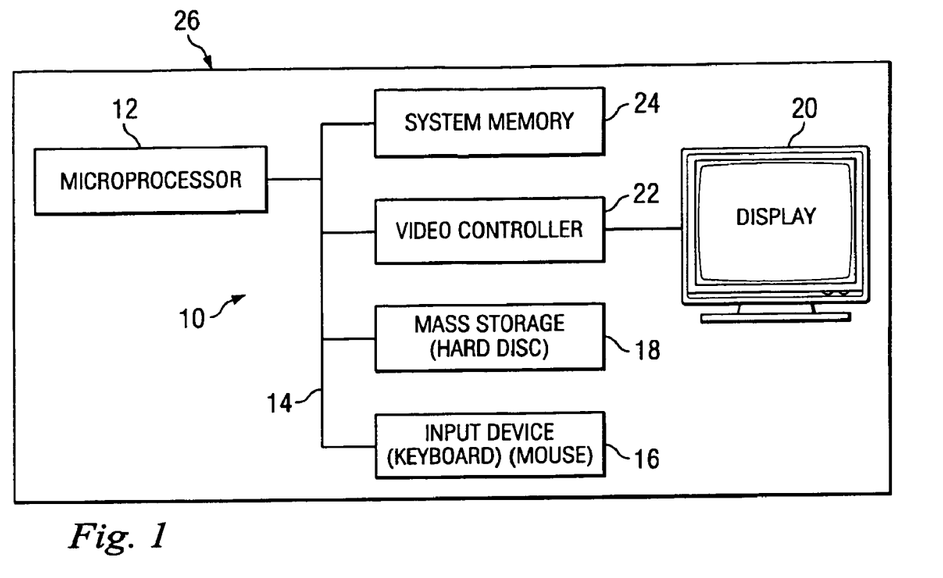
FIG. 1 is a schematic view illustrating an embodiment of an information handling system.

In one embodiment, information handling system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. In an embodiment, a chassis 26 may house some or all of the components of information handling system 10. It should be understood that other busses and intermediate circuits can be deployed between the components described above and microprocessor 12 to facilitate interconnection between the components and the microprocessor.

Figure 2:
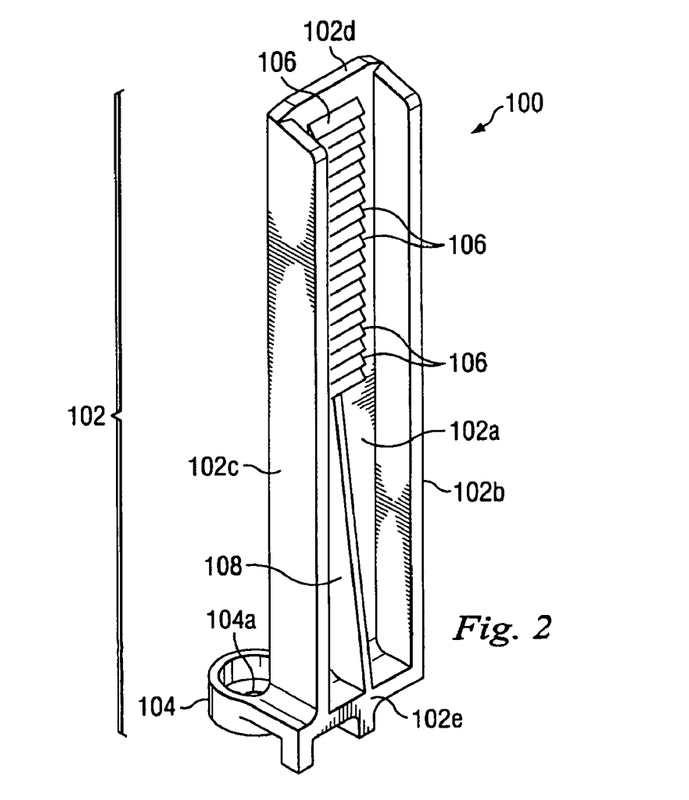
FIG. 2 is a perspective view illustrating an embodiment of a reinforced card support post.

Referring now to FIG. 2, a reinforced card support post 100 is illustrated. Card support post 100 includes an elongated member 102 having a base wall 102a and two side walls 102b and 102c which are substantially parallel and spaced apart from each other and extend from opposite sides of the base wall 102a to give the elongated member 102 a U-shaped cross section which provides reinforcement for the reinforced card support post 100 along its length. In an embodiment, the elongated member 102 may have a variety of cross sectional configurations which are known in the art to provide reinforcement for the reinforced card support post 100 along its length. Elongated member 102 also includes a securing end 102d and a mounting end 102e which are located on opposite ends of the elongated member 102. A board mounting member 104 extends from the mounting end 102e of the elongated member 102 and defines a mounting aperture 104a extending through the board mounting member 104. A plurality of ratchet teeth 106 extend from the base wall 102a and are located along the base wall from approximately the midpoint of the elongated member 102 to the securing end 102d on the elongated member 102. In an embodiment, a reinforcing member 108 extends from the mounting end 102e of the elongated member 102 and along the base wall 102a to the ratchet teeth 106 and is located between the side walls 102b and 102c.

Figure 3A:
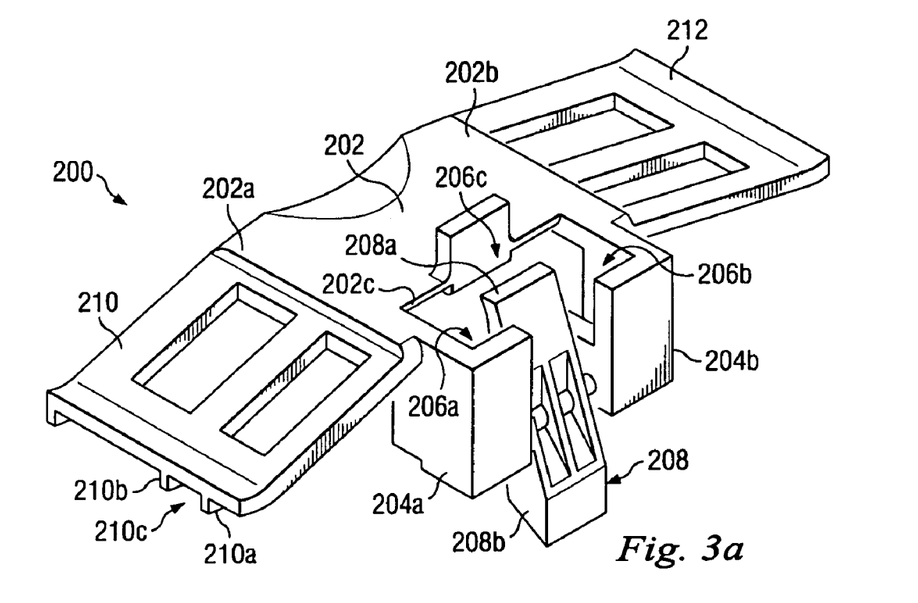
FIG. 3a is a top perspective view illustrating an embodiment of a securing device used with the card support post of FIG. 2.
Figure 3B:
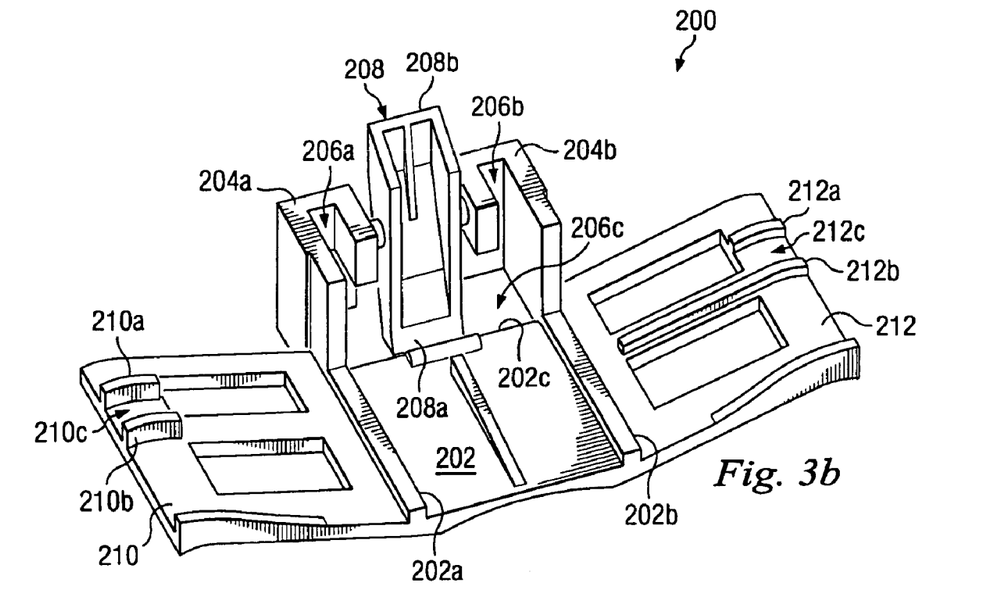
FIG. 3b is a bottom perspective view illustrating an embodiment of a securing device used with the card support post of FIG. 2.

Referring now to FIGS. 3a and 3b, a card securing device 200 is illustrated. Card securing device 200 includes a base 202 having a pair of opposing sides 202a and 202b and a front end 202c which extends between the sides 202a and 202b. A pair of ratchet supports 204a and 204b extend from the front end 202c of the base 202 and adjacent the sides 202a and 202b, respectively. The ratchet supports 204a and 204b define a pair of side wall channels 206a and 206b, respectively, along their lengths, and also define a base wall channel 206c located adjacent the front end 202c of the base 202 and along the length of the front end 202c. A ratchet member 208 is pivotally coupled to the ratchet supports 204a and 204b and includes a securing end 208a which extends into the base wall channel 206c and a release end 208b which is located opposite the securing end 208a. A resilient member 210 extends from the side 202a of the base 202 and includes a plurality of ridges 210a and 210b which extend from a surface of the resilient member 210 and define a card securing channel 210c between them. A resilient member 212 extends from the side 202b of the base 202 and includes a plurality of ridges 212a and 212b which extend from a surface of the resilient member 212 and define a card securing channel 212c between them.

Figure 4:
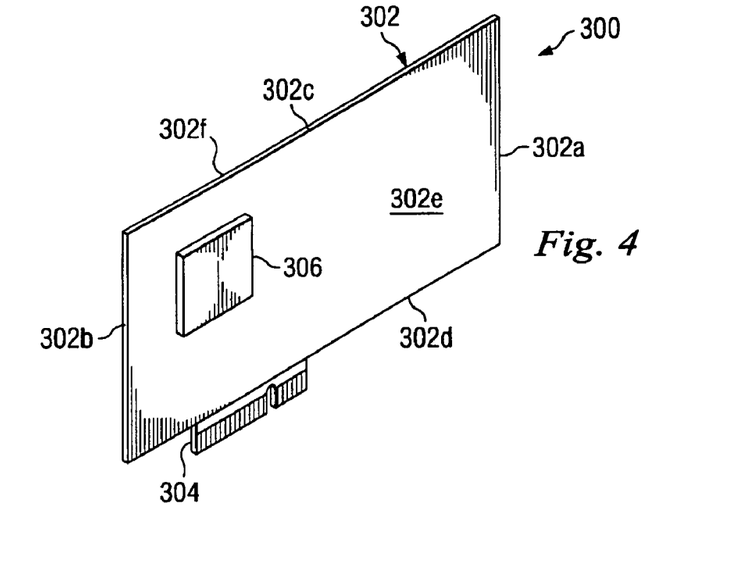

Referring now to FIG. 4, a card 300 is illustrated. Card 300 includes a base 302 having a front end 302a, a rear end 302b located opposite the front end 302a, a top end 302c extending between the front end 302a and the rear end 302b, a bottom end 302d located opposite the top end 302c and extending between the front end 302a and the rear end 302b, and a pair of opposing sides 302e and 302f extending between the front end 302a, the rear end 302b, the top end 302c, and the bottom end 302d. A coupling member 304 extends from the bottom end 302d and is located adjacent the rear end 302b of the card 300. In an embodiment, the coupling member 304 is operable to connect to a PCI-Express connector. A card component 306 is mounted to the card 300 and is located adjacent the rear end 302b of the card 300. In an embodiment, the card 300 is a video card. In an embodiment, the card component 306 is a graphics processing unit (GPU).

Figure 5:
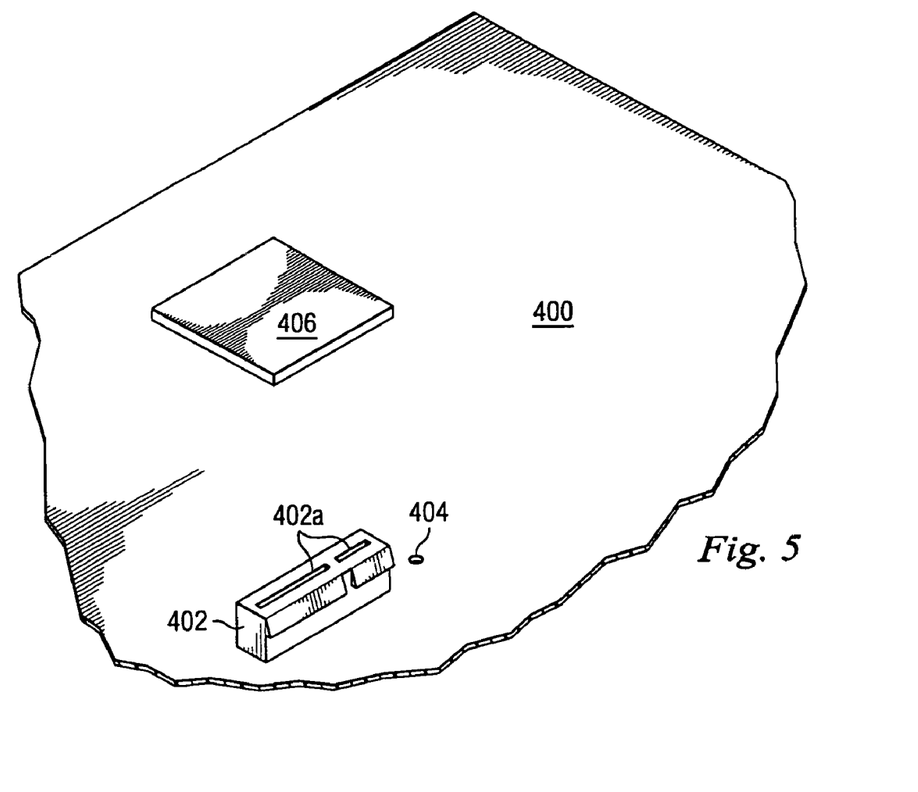
FIG. 5 is a perspective view illustrating an embodiment of a board used with the card support post of FIG. 2, the securing device of FIG. 3a, and the card of FIG. 4.

Referring now to FIG. 5, a board 400 is illustrated. The board 400 may be mounted in a chassis such as, for example, the chassis 26 described above with reference to FIG. 1, and may include components of an information handling system such as, for example, the information handling system 10 described above with reference to FIG. 1. A card connector 402 is mounted to the board 400 and defines a card slot 402a along its length. In an embodiment, the card connector 402 is a PCI-Express connector. A mounting aperture 404 is defined by the board 400 and located adjacent the card connector 402. An information handling system component 406 is mounted to the board 400 and may be electrically coupled to the card connector 402. In an embodiment, the information handling system component 406 may be, for example, the microprocessor 12 described above with reference to FIG. 1.

Figure 6A:
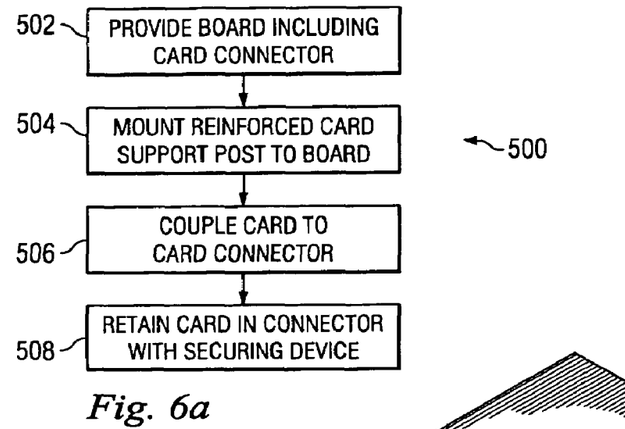
FIG. 6a is a flow chart illustrating an embodiment of a method for retaining a card in an information handling system.
Figure 6B:
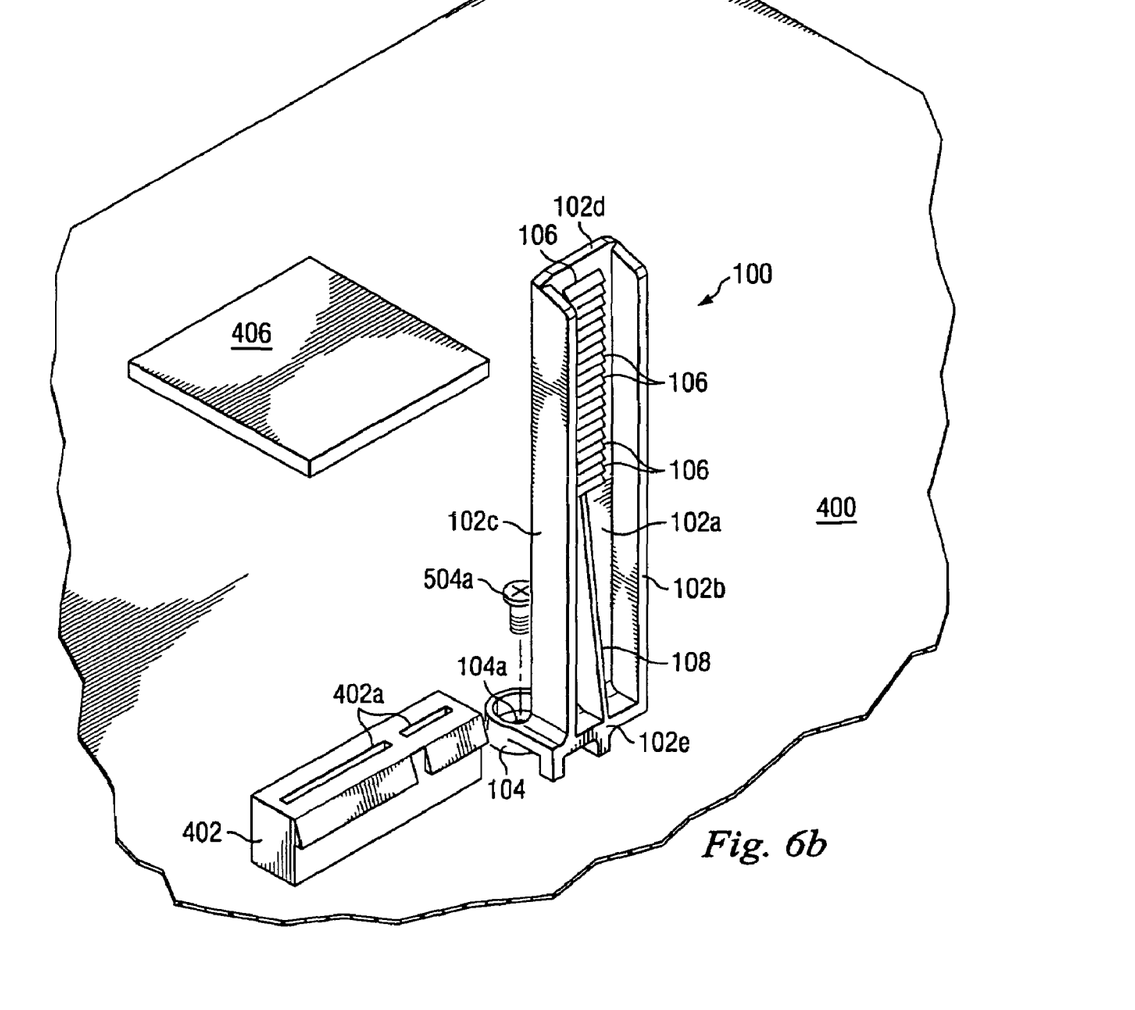

Referring now to FIGS. 2, 5, 6a, and 6b, a method 500 for retaining a card in an information handling system is illustrated. The method 500 begins at step 502 where the board 400 including the card connector 402 is provided, as illustrated in FIG. 5. The method then proceeds to step 504 where the reinforced card support post 100 is mounted to the board 400. The card support post 100 is positioned adjacent the card connector 402 on board 400 such that the mounting aperture 104a defined by board mounting member 104 is aligned with the mounting aperture 404 on the board 400. A fastener 504a which may be, for example, the threaded fastener illustrated in FIG. 6b, is then used to mounted the card support post 100 to the board 400. When the card support post 100 mounted to the board 400, the elongated member 102 on card support post 100 extends from the board 400 adjacent the card connector 402, as illustrated in FIG. 6b. In an embodiment, the card support post 100 may be positioned at a variety of different locations adjacent the card connector 402.

Figure 6C:
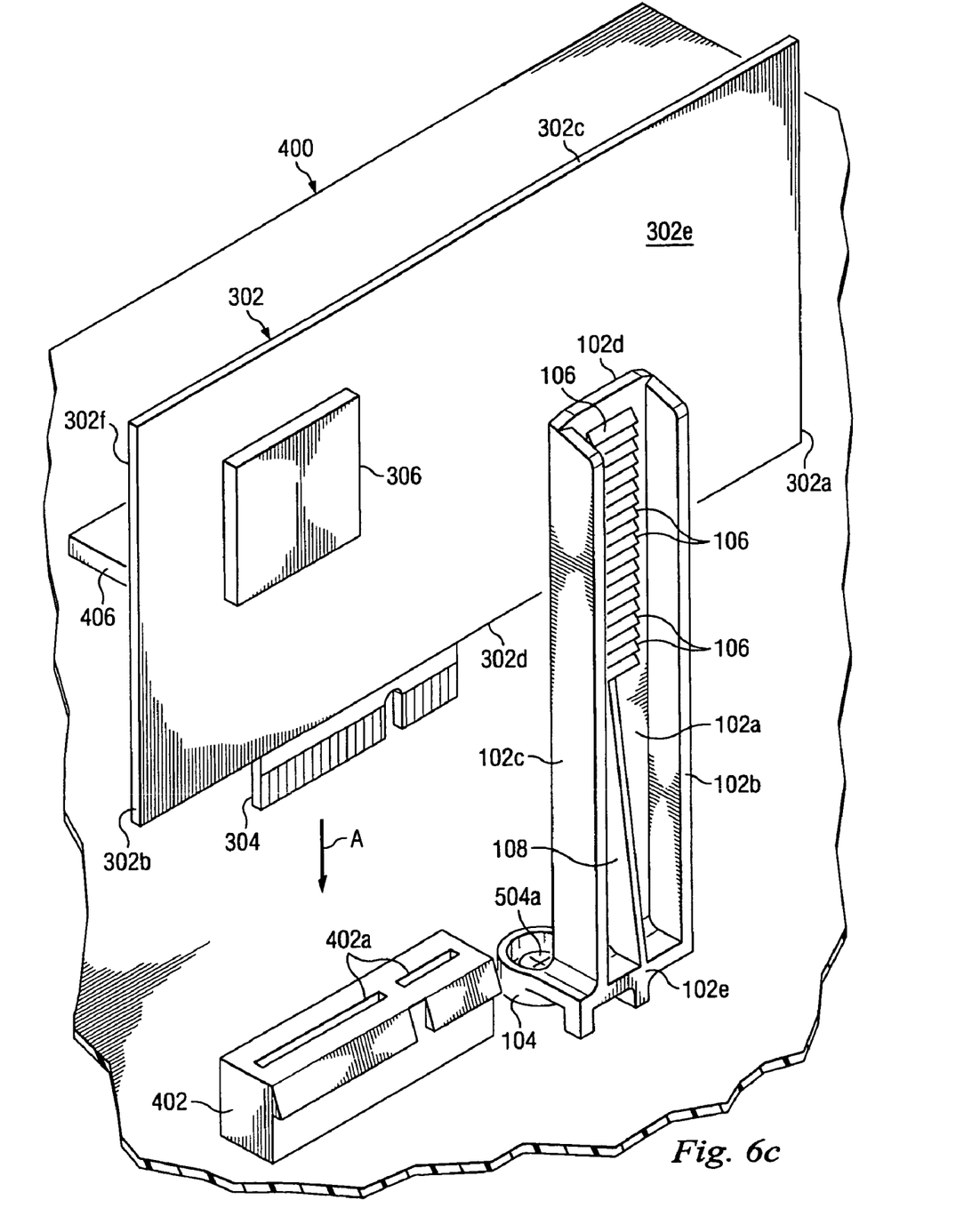
Figure 6D:
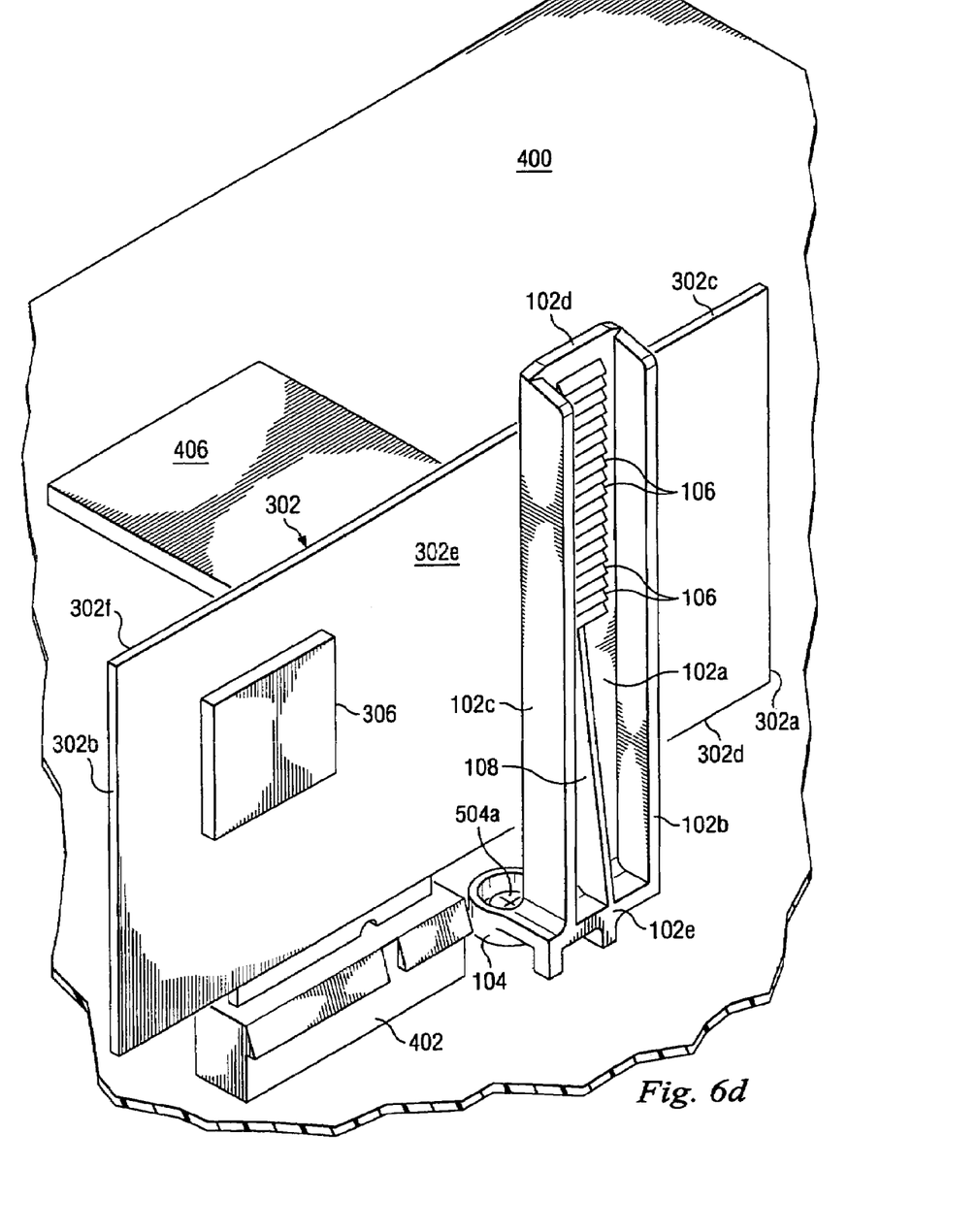

Referring now to FIGS. 4, 6a, 6c, and 6d, the method 500 proceeds to step 506 where the card 300 is coupled to the card connector 402. The card 300 is positioned over the board 400 such that the side 302e of the card 300 is adjacent the card support post 100, the bottom end 302d of the card is adjacent the board 100, and the coupling member 304 is aligned with the card slot 402a on the card connector 402, as illustrated in FIG. 6c. The card 300 is then moved in a direction A such that the coupling member 304 on the card 300 matingly engages the card connector 402 through the card slot 402a, as illustrated in FIG. 6d. With the card 300 engaging the card connector 402, the top end 302c of the card 300 is positioned below the securing end 102d of the card support post 100, and the card 300 is oriented substantially parallel to the card support post 100.

Figure 6E:
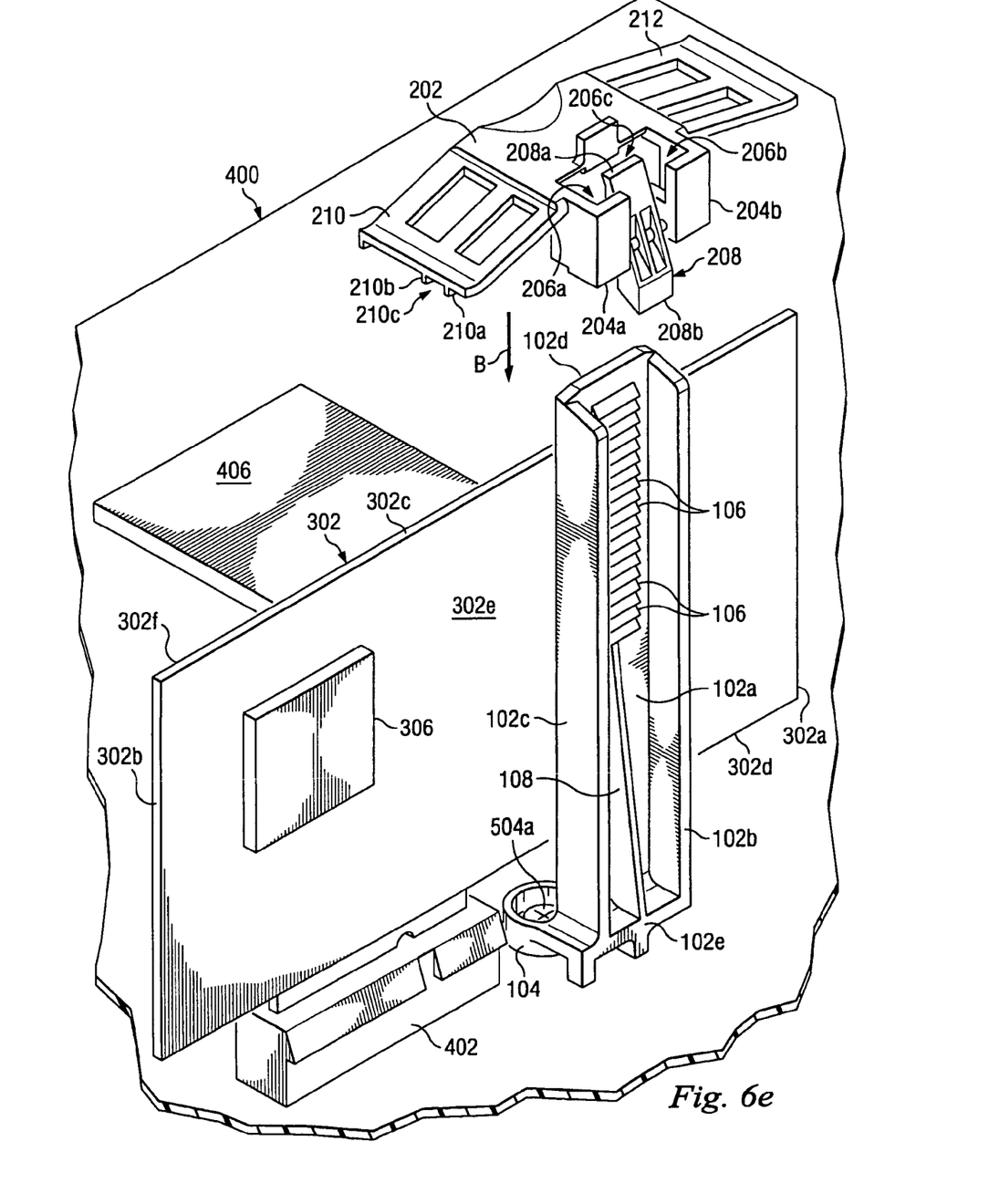
Figure 6F:
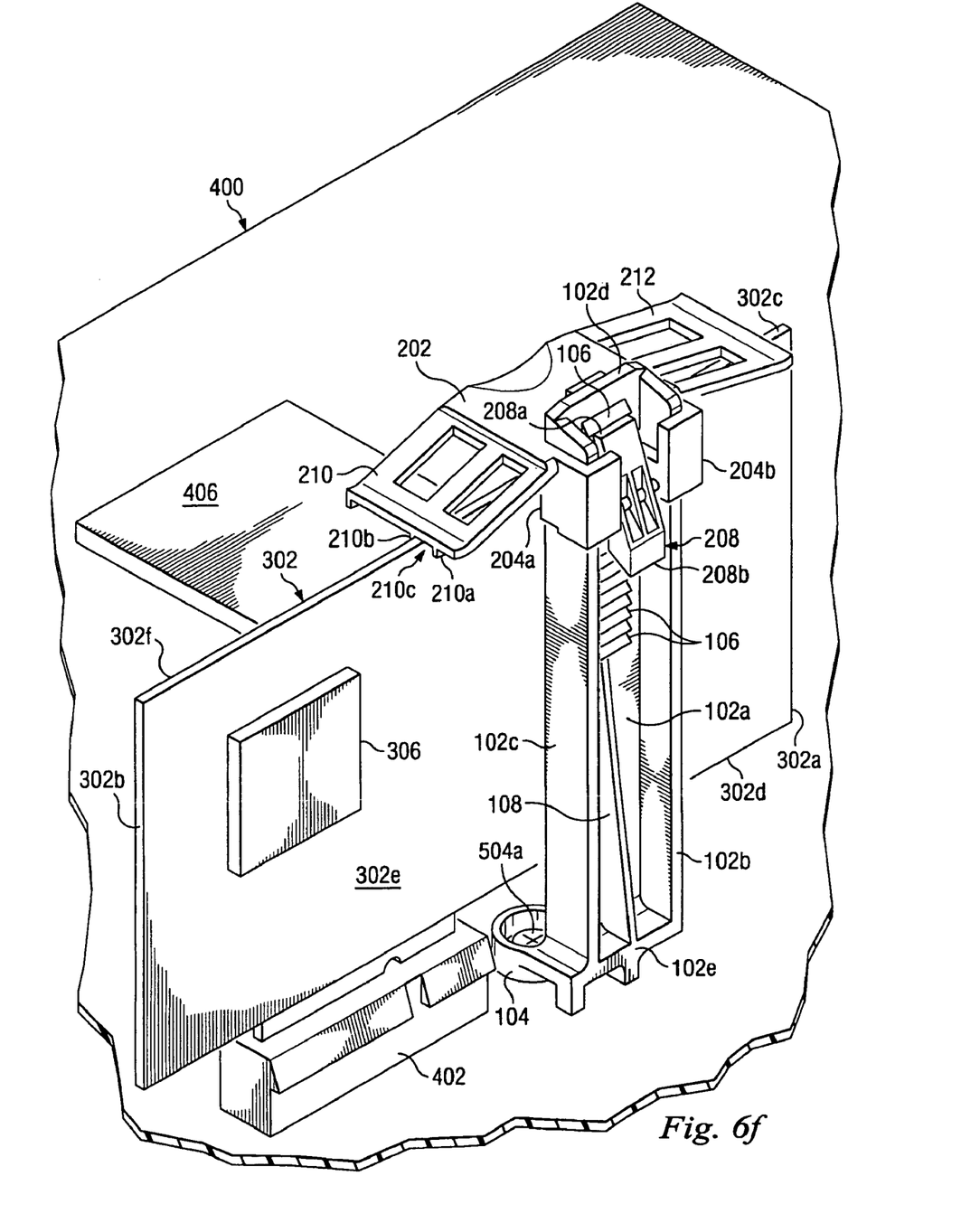

Referring now to FIGS. 3b, 6a, 6e, and 6f, the method 500 proceeds to step 508 where the card 300 is retained in the card connector 402 with the securing device 200. The securing device 200 is positioned adjacent the card 300 and the card support post 100 such that the base 202 and the resilient members 210 and 212 on the securing device 200 are positioned adjacent the top end 302c of the card 300 and the base wall channel 206c and the side wall channels 206a and 206b on the securing device 200 are positioned adjacent the base wall 102a and the side walls 102c and 102b, respectively, as illustrated in FIG. 6e. The securing device 200 is then moved in a direction B such that it engages the securing end 102d of the card support post 100. As the securing device 200 engages the card support post 100 and continues in the direction B, the base wall 102a enters the base wall channel 206c and the sides walls 102c and 102b enter the side wall channels 206a and 206b, respectively. Further movement of the securing device 200 in direction B results in the securing end 208a on ratchet member 208 engaging the ratchet teeth 106 on the card support post 100, the top end 302c of the card 300 engaging the resilient member 210 in the card securing channel 210c between the ridges 210a and 210b, and the top end 302c of the card 300 engaging the resilient member 212 in the card securing channel 212c between the ridges 212a and 212b. The securing device 200 may then retain the card 300 in the card connector 402 on the board 400 by moving the securing device in direction B until the ratchet member 208 engages the ratchet teeth 106 such that the resilient members 210 and 212 apply a force to the top end 302c of the card 300 in the direction B which is sufficient to retain the card 300 in the card connector 402. With the card 300 retained in the card connector 402 with the card support post 100 and the securing device 200, flexing of the card 300 is reduced. With the card secured in the card securing channel 210c, any flexing of the card 300 is translated to the card support post 100, which is reinforced and supported by the board mounting member 104 mounted to the board 400. The card 300 may then be released from the card connector 402 by pressing the releasing end 208b on ratchet member 208 to disengage the securing end 208a from the ratchet teeth 106 and moving the securing device 200 in a direction opposite the direction B to decouple the securing device 200 from the card support post 100. The card 300 may then be removed from the card connector 402. In an embodiment, a variety of different means known in the art may be used to couple the securing device 200 to the card support post 100 in place of the ratchet member 208 and the ratchet teeth 106.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A card retaining apparatus comprising:
   a single reinforced card support post including a board mounting member, wherein the single reinforced card support post is operable to be positioned adjacent only one side of a card in order to support the card adjacent the single reinforced card support post; and
   a card securing device which is operable to couple to the single reinforced card support post, the card securing device being adjustably coupled to the single reinforced card support post, the card securing device including a pair of resilient members extending laterally from the post in opposite directions, each of the resilient members having a channel for engaging a card and adjustably applying a force to the card supported adjacent the single reinforced card support post.

2. The apparatus of claim 1 wherein the reinforced card support post comprises a U-shaped cross section.

3. The apparatus of claim 1 wherein the reinforced card support post comprises a plurality of ratchet teeth.

4. The apparatus of claim 1 wherein the board mounting member is located on a distal end of the reinforced card support post.

5. The apparatus of claim 1 wherein the card securing device comprises a ratchet member.

6. The apparatus of claim 1 wherein the card securing device defines a card securing channel.

7. The apparatus of claim 1 wherein the board mounting member is operable to mount the reinforced card support post to a board and the card securing device is operable to couple to the reinforced card support post to retain a card to the board.

8. An information handling system comprising:
   a board;
   a microprocessor mounted to the board;
   a memory coupled to the microprocessor;
   a card connector mounted to the board;
   a single reinforced card support post mounted to the board adjacent the card connector such that when a card is coupled to the card connector, the single reinforced card support post is located adjacent only one side of the card; and
   a card securing device which is operable to couple to the single reinforced card support post, the card securing device being adjustably coupled to the single reinforced card support post, the card securing device including a pair of resilient members extending laterally from the cost in opposite directions, each of the resilient members having a channel for engaging a card and adjustably applying a force to the card supported adjacent the single reinforced card support post.

9. The system of claim 8 wherein the reinforced card support post comprises a U-shaped cross section.

10. The system of claim 8 wherein the reinforced card support post comprises a plurality of ratchet teeth.

11. The system of claim 8 wherein the card securing device comprises a ratchet member.

12. The system of claim 8 wherein the card securing device defines a card securing channel.

13. The system of claim 8 further comprising:
    a card coupled to the card connector, whereby the card securing device is coupled to the reinforced card support post and engages the card.

14. The system of claim 13 wherein the card comprises a video card.

15. The system of claim 13 wherein the engagement of the card securing device with the card reduces flexing of the card.

16. A method for retaining a card in an information handling system chassis comprising:

provTransformsing a board including a card connector mounted to the board;

mounting a single reinforced card support post to the board and adjacent the card connector;

coupling a card to the card connector, whereby the single reinforced card support post is located adjacent only one side of the card; and retaining the card in the card connector by coupling a card securing device to the single reinforced card support post and engaging the card with the card securing device, the card securing device being adjustably coupled to the single reinforced card support post, the card securing device including a pair of resilient members extending laterally from the post in opposite directions, each of the resilient members having a channel for engaging a card and adjustably applying a force to the card supported adjacent the single reinforced card support post.

17. The method of claim 16 wherein the retaining comprises reducing flexing of the card.

* * * * *

UNITED STATES PATENT AND TRADEMARK OFFICE
CERTIFICATE OF CORRECTION

PATENT NO. : 7,278,872 B2
APPLICATION NO. : 11/170802
DATED : October 9, 2007
INVENTOR(S) : Gregory Brown et al.

It is certified that error appears in the above-identified patent and that said Letters Patent is hereby corrected as shown below:

Claim 8, Column 6, Line 50, delete "cost" and insert --post--.

Signed and Sealed this

Twenty-ninth Day of April, 2008

JON W. DUDAS
*Director of the United States Patent and Trademark Office*

UNITED STATES PATENT AND TRADEMARK OFFICE
CERTIFICATE OF CORRECTION

PATENT NO. : 7,278,872 B2  
APPLICATION NO. : 11/170802  
DATED : October 9, 2007  
INVENTOR(S) : Gregory Brown et al.

Page 1 of 1

It is certified that error appears in the above-identified patent and that said Letters Patent is hereby corrected as shown below:

Claim 8, Column 6, Line 50, delete "cost" and insert --post--.

Signed and Sealed this

Seventh Day of October, 2008

JON W. DUDAS  
*Director of the United States Patent and Trademark Office*